(12) United States Patent
Lin et al.

(10) Patent No.: US 6,207,475 B1
(45) Date of Patent: Mar. 27, 2001

(54) METHOD FOR DISPENSING UNDERFILL AND DEVICES FORMED

(75) Inventors: Shih Hsiung Lin, Hsinchu; Hsing Seng Wang, Tau Yuan, both of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/281,605

(22) Filed: Mar. 30, 1999

(51) Int. Cl.[7] .............................. H01L 21/48; H01L 21/50
(52) U.S. Cl. ........................... 438/108; 438/127; 257/778
(58) Field of Search .................................... 438/108, 127; 257/778; 361/783

(56) References Cited

U.S. PATENT DOCUMENTS

| | | | |
|---|---|---|---|
| 5,218,234 | * | 6/1993 | Thompson et al. . |
| 5,681,757 | * | 10/1997 | Hayes . |
| 5,710,071 | * | 1/1998 | Beddingfield et al. . |
| 5,817,545 | * | 10/1998 | Wang et al. . |
| 5,861,678 | * | 1/1999 | Schrock . |
| 5,893,724 | * | 4/1999 | Chakravorty et al. . |
| 5,942,798 | * | 8/1999 | Chiu . |
| 5,985,694 | * | 11/1999 | Cho . |

* cited by examiner

Primary Examiner—Charles Bowers
Assistant Examiner—Stephen W. Smoot
(74) Attorney, Agent, or Firm—Tung & Associates (57) ABSTRACT

A method for dispensing underfill in a flip chip package formed of an IC chip and a substrate and devices formed by such methods are disclosed. The method for dispensing may be carried out by either a screen printing (or stencil printing) or a dispensing head process wherein droplets of an underfill material may be dispensed on the surface of an IC die or a substrate. Numerous benefits may be achieved by the present invention for dispensing an underfill material which includes shorter cycle time, superior quality product and more flexible processing parameters. The underfill material may be cured in the same reflow furnace during the reflow process for the solder balls such that a separate curing process can be eliminated.

12 Claims, 5 Drawing Sheets

METHOD FOR DISPENSING UNDERFILL AND DEVICES FORMED

FIELD OF THE INVENTION

The present invention generally relates to a method for dispensing underfill in a flip chip package formed of an IC chip and a substrate and devices formed by such method and more particularly, relates to a method for dispensing underfill in a flip chip package formed of an IC chip and a substrate either by a screen printing or a stencil printing technique, or by using dispensing nozzles for dispensing droplets of underfill onto a chip or substrate and devices formed by such methods.

BACKGROUND OF THE INVENTION

In the fabrication of modern semiconductor devices, the ever increasing device density and decreasing device dimensions demand more stringent requirements in the packaging or interconnecting techniques of the devices. In recent years, a flip-chip attachment method or a flip-chip direct chip attachment (DCA) method has been used in packaging integrated circuit chips. In the flip-chip attachment method, instead of attaching an integrated circuit lead frame in a package, an array of solder balls is formed on the surface of the die for the subsequent bonding to a printed circuit board or an interposer. The formation of the solder balls can be carried out by an evaporation method utilizing a solder material consisting mainly of tin and lead through a mask to produce the balls in a desired pattern. More recently, the techniques of eletrodeposition or printing have been used to mass produce solder balls in a flip-chip packaging process.

In the flip-chip attachment method, all the interconnections between a semiconductor chip and a printed circuit board (PCB) or an interposer can be formed simultaneously and therefore maximizing fabrication throughputs. For instance, in direct chip attachment, solder bumps or solder balls are used to connect a chip directly to a printed circuit board or an interposer. In a regular printed circuit board, the density of the interconnections is not formed high enough to match that normally found on a chip surface. In other words, the pitch between the bond pads formed on a chip is smaller than the pitch formed between interconnections on a printed circuit board. An interposer is therefore used to provide a transition and to accommodate the bond pads/interconnections which are spaced differently. An interposer board is frequently fabricated of the same material as that used in the printed circuit board, i.e., an epoxy-type polymeric material. When a high density interconnect printed circuit board is utilized in a flip-chip method for bonding to a semiconductor chip, the use of the interposer may not be necessary.

The use of organic substrates, or polymeric-base substrates, in printed circuit boards or interposers introduces a new source of problem for the flip-chip bonding of a silicon chip which is mostly inorganic to such substrates. The problem is the mismatch of coefficients of thermal expansion (CTE) between the printed circuit board and the silicon chip. The coefficient of thermal expansion for the printed circuit board material is at least five times that of the silicon material. The extreme mismatch in CTE's between the silicon chip and the organic substrate of the printed circuit board therefore subjects solder joints formed thereinbetween to extremely large thermal strains, which leads to premature failure of the solder connections.

One method proposed for alleviating such thermal strains is the introduction of an encapsulating layer between the silicon chip and the organic substrate. The encapsulating material, known as an underfill, which is typically a silica filled epoxy is used to fill the gap (or standoff) between the printed circuit board and the silicon chip. Since the silicon chip is normally covered, in a final fabrication step, by a polymer passivation/stress buffer layer such as a polyimide film, the underfill forms a bond between the polyimide layer on the chip and the organic substrate of the printed circuit board encapsulating the solder joints.

Figure 1:
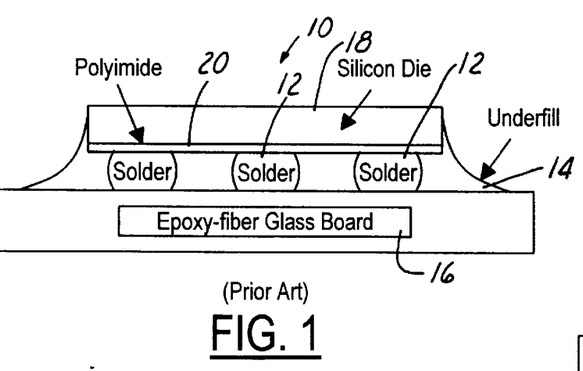
FIG. 1 is a schematic showing an enlarged, cross-sectional view of a conventional flip chip package including an IC die and a substrate bonded by a plurality of solder balls and an underfill material.

Referring initially to FIG. 1, wherein a flip-chip 10 bonded by a plurality of solder balls 12 and an underfill layer 14 is shown. The encapsulating material, or the underfill layer 14, is typically a silica fill epoxy for filling the gap, or the standoff, between the printed circuit board 16 and the silicon chip 18. As shown in FIG. 1, the underfill layer 14 forms a bond between a polyimide layer 20, which is a passivation/stress buffer layer that covers the silicon chip 18, and the printed circuit board 16 encapsulating the solder balls 12.

Figure 2A:
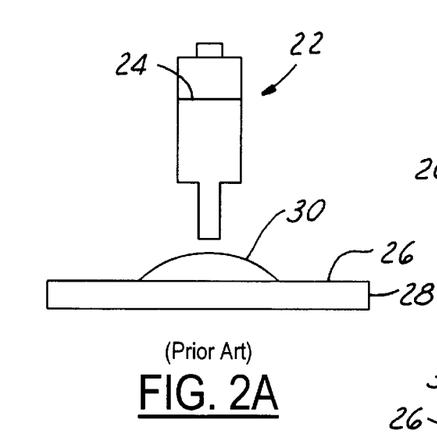
FIG. 2A is a schematic illustrating a conventional method for dispensing an underfill material on the top surface of a substrate.
Figure 2B:
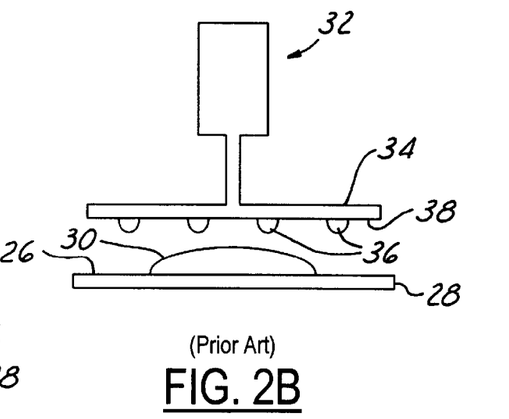
FIG. 2B is a schematic showing the conventional method of FIG. 2A with an IC chip positioned on top of a substrate.
Figure 2C:
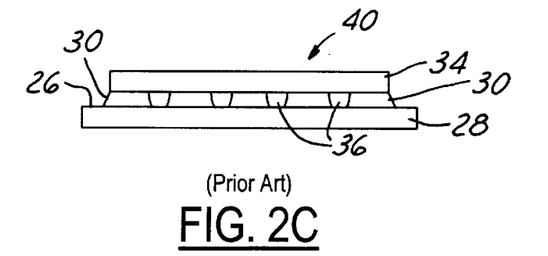
FIG. 2C is a schematic illustrating the conventional method for dispensing underfill shown in FIG. 2A after the IC die is bonded to the substrate with the underfill material thereinbetween.

While the introduction of the underfill layer between a silicon chip and an organic substrate for the printed circuit board has enhanced the thermal cycling resistance of a flip chip assembly, the dispensing of the underfill material in between a silicon chip and a substrate and filling the gap is a time consuming task. In one conventional method, as shown in FIGS. 2A~2C, an underfill dispenser 22 is first used to dispense an underfill material 24 onto the top surface 26 of a substrate 28. A layer 30 of the underfill material 24 is thus formed on the top surface 26. A chip holder 32, usually a vacuum holder, is then used to position an IC chip 34 which is pre-deposited with a plurality of solder balls 36 on a top surface 38 over the substrate 28. The IC chip, or die 34 is then pressed onto the substrate 28 with the plurality of solder balls 36 connecting to corresponding electrical conductors (not shown) on the surface 26 of the substrate 28. The assembly 40 for the flip chip is then placed in a reflow oven and heated to a temperature not less than the reflow temperature for the solder material utilized in the plurality of solder balls 36. The reflow process further cures the underfill material 30 and improves its mechanical strength.

Several drawbacks are inherent in this technique, for instance, there is possibly an underfill material layer between the plurality of solder balls on the IC chip and the plurality of electrical conductors on the substrate. Since the underfill material is an insulating material, this affects the contact resistance formed between the joints. Secondly, in the process of pressing the IC die 34 onto the underfill material layer 30, air entrapment in the underfill material 30 is inevitable. Trapped air bubbles in the underfill material layer 30, or in the epoxy material layer 30, affects the mechanical strength enhancement by the underfill material and furthermore, affects the adhesion formed between the underfill material and the IC die or the substrate.

Figure 3A:
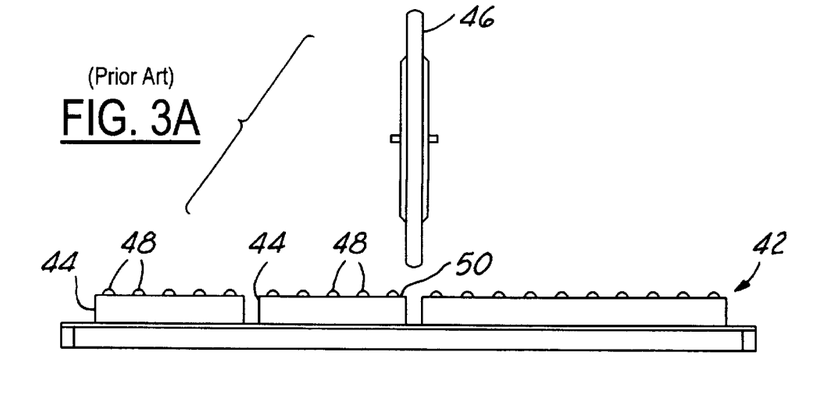
FIG. 3A is a schematic of another conventional method in which a diamond saw is first used to severe IC dies from a wafer.
Figure 3B:
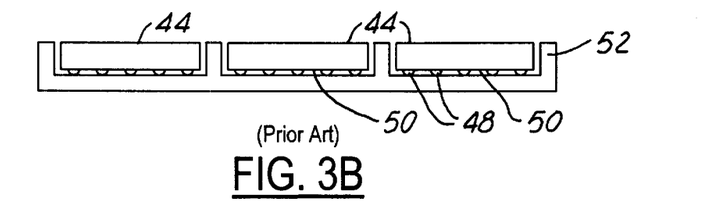
FIG. 3B is a schematic illustrating the severed IC dies positioned in a storage tray.
Figures 3C, 3D, 3E, 3F, 4A:
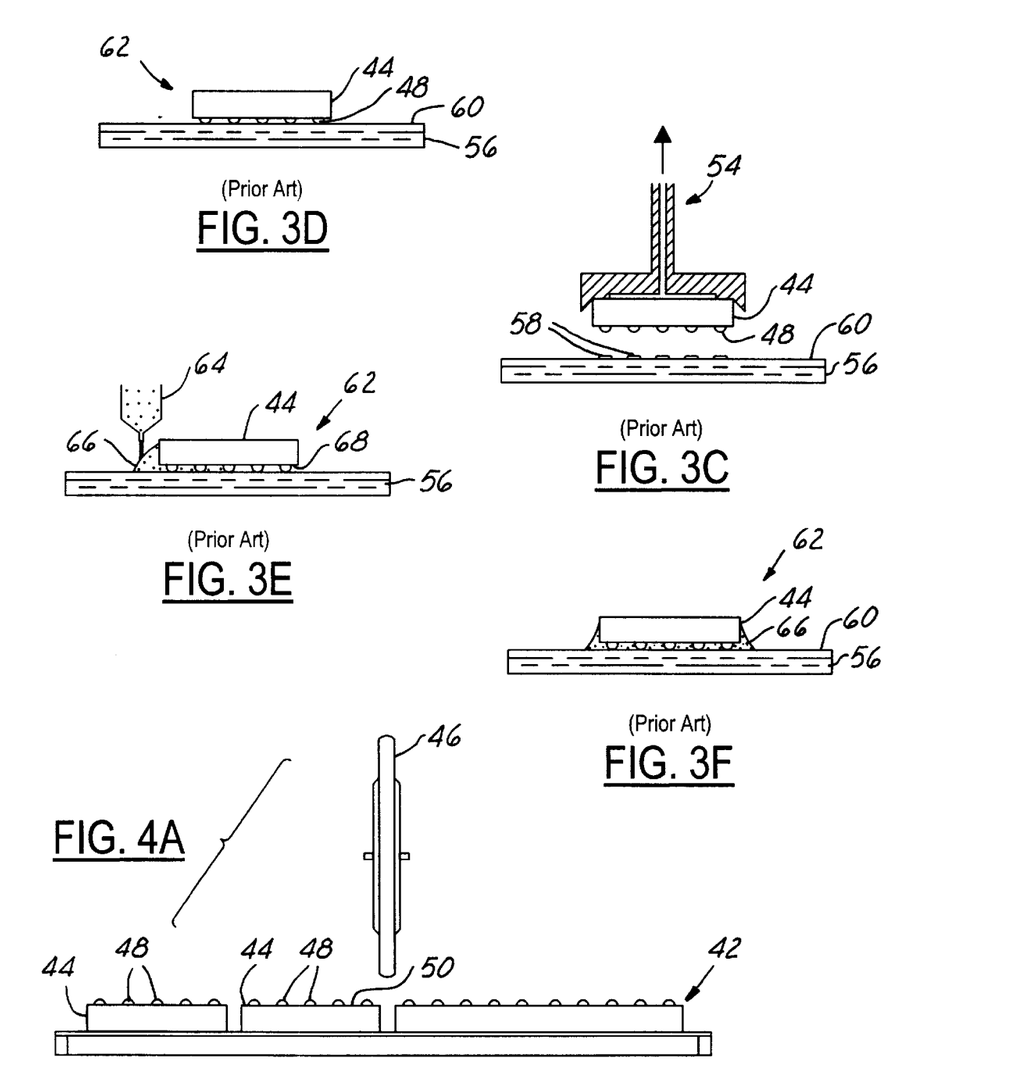
FIG. 3C is a schematic illustrating an IC die positioned over a corresponding substrate by a vacuum die holding device.
FIG. 3D is a schematic illustrating an IC die bonded to a substrate.
FIG. 3E is a schematic illustrating the flip chip package of FIG. 3D with the gap between the die and the substrate filled by capillary effect of an underfill material.
FIG. 3F is a schematic showing a flip chip package of FIG. 3E after the gap between the die and the substrate is filled with the underfill material.
FIG. 4A is a schematic illustrating a present invention method of dispensing underfill wherein a wafer is first severed by a diamond saw.

In another conventional technique for dispensing underfill materials, as shown in FIGS. 3A~3F, an underfill material is fed into the standoff between an IC die and a substrate by the capillary effect on the underfill liquid. As shown in FIG. 3A, a wafer 42 is first sectioned into individual dies 44 by a diamond saw 46. The IC dies 44 are provided with a plurality of solder balls 48 on a top surface 50 of the dies. After all the dies 44 are severed from wafer 42, they are placed in a holding tray 52, as shown in FIG. 3B. In the next step of the process, a vacuum head 54 is used to remove an IC die 44 from the tray 52 and to position the die over a substrate 56. It is noted that a plurality of electrical conductors 58, corresponding to the number and positions of the solder balls 48 are provided on a top surface 60 of the substrate 56. It should be noted that the substrate 56 may be either a printed circuit board or an interposer. After the IC die 44 is mounted to substrate 56 by intimately contacting the solder balls 48 with the electrical conductors 58, as shown in FIG. 3D, a solder reflow process is carried out to reflow the solder and to form a permanent bond between the IC die 44 and the substrate 56. It should be noted that the plurality of electrical conductors 58 are not shown in FIG. 3D for simplicity reasons.

The flip chip package 62 is now ready for the underfill process in which an underfill dispenser 64, such as a liquid syringe, is used to dispense an underfill material 66 at an edge of the flip chip package 62. Since a gap 68, or the standoff, between the chip 44 and the substrate 56 is relatively small, i.e., in the neighborhood between about 50 $\mu$m and about 100 $\mu$m, a capillary effect causes the underfill material 66 to flow into the gap 68 and fill up the gap. Since the underfill dispensing process utilizes capillary effect, several factors may influence the underfill filling process. For instance, the viscosity of the underfill materials 56 and the temperature of the substrate 56 and the IC die 44. Moreover, the capillary flow process for the underfill material 56 is time consuming, i.e., up to 1 minute flow time is required to fill under an IC die which has a dimension of 10 mm×10 mm. A completed flip chip 62 with the underfill dispensed between the IC die 44 and the substrate 56 is shown in FIG. 3F.

It is therefore an object of the present invention to provide a method for dispensing underfill in a flip chip package that does not have the drawbacks or shortcomings of the conventional methods.

It is another object of the present invention to provide a method for dispensing underfill in a flip chip package that does not require a long flow time for the underfill material to fill a gap between an IC die and a substrate.

It is a further object of the present invention to provide a method for dispensing an underfill material in a flip chip package that utilizes a screen printing or a stencil printing technique for achieving a short cycle time.

It is still another object of the present invention to provide a method for dispensing an underfill material in a flip chip package that utilizes a screen printing or a stencil printing technique such that a multiple number of flip chip packages may be fabricated at the same time.

It is another further object of the present invention to provide a method for dispensing an underfill material in a flip chip package that utilizes a dispensing nozzle head equipped with a plurality of liquid dispensing nozzles such that droplets of underfill material may be dispensed on top of an IC die filling the gaps between solder balls.

It is yet another object of the present invention to provide a method for dispensing an underfill in a flip chip package that utilizes a dispensing nozzle head equipped with a plurality of liquid dispensing nozzles such that droplets of an underfill material may be dispensed onto the surface of a substrate and thus filling the gaps between electrical conductors.

It is still another further object of the present invention to provide a method for dispensing underfill in a flip chip package that is formed of an IC chip and a substrate by utilizing a stencil equipped with slot openings in a tapered form for dispensing an underfill material by a squeegee into the standoff between the chip and the substrate.

It is yet another further object of the present invention to provide a method for dispensing underfill in a flip chip package formed of an IC chip and a substrate in which the solder reflow process and the underfill curing process are conducted in the same heat treatment process.

SUMMARY OF THE INVENTION

In accordance with the present invention, a method for dispensing underfill in a flip chip package formed of an IC chip and a substrate and devices formed by such method are provided.

In a preferred embodiment, a method for dispensing underfill in a flip chip package formed of an IC chip and a substrate can be carried out by the operating steps of first providing a flip chip package of an IC chip bonded to a substrate by a plurality of spaced-apart solder balls, a gap formed between the IC chip, the substrate and the plurality of spaced-apart solder balls, then positioning a stencil on top of and in intimate contact with a top surface of the IC chip, the stencil is provided with at least one slot opening corresponding to at least one edge of the IC chip such that the slot opening is in fluid communication with the gap, and then flowing an underfill material across a top surface of the stencil in a direction toward the IC chip such that the underfill material flows through the at least one slot opening and filling the gap between the IC chip, the substrate and the plurality of spaced-apart solder balls.

The gap in the flip chip package is a standoff between the plurality of solder balls. The step for providing a flip chip package may further include the steps of providing an IC chip which has a first plurality of bond pads formed on a first surface, providing a substrate which has a first plurality of electrical conductors formed on a second surface, and bonding the first plurality of bond pads to the first plurality of electrical conductors by a first plurality of spaced-apart solder balls. The method may further include the step of reflowing the solder balls at an elevated reflow temperature. The gap or the standoff formed between the IC chip, the substrate and the plurality of spaced-apart solder balls is between about 35 $\mu$m and about 200 $\mu$m. The method may further include the step of providing a stencil which has at least two slot openings corresponding to two adjacent edges of the IC chip such that the at least two slot openings are in fluid communication with the gap. The method may further include the step of providing a stencil that has at least three slot openings corresponding to three adjacent edges of the IC chip such that the at least three slot openings are in fluid communications with the gap.

The method may further include the step of positioning a stencil on top of and in intimate contact with top surfaces of multiplicity of IC chips, the stencil is provided with at least one slot opening corresponding to and for at least one edge of each of the multiplicity of IC chips. When the stencil is provided with at least three slot openings, the at least three slot openings are positioned corresponding to three adjacent edges of an IC chip wherein the openings are arranged in an U-shaped with the slot opening in the bottom of the U-shaped being first contacted by the flow of underfill material. The at least three slot openings corresponding to three adjacent edges of the IC chip may further be arranged in an U-shape with the slot openings in the two sides of the U-shape being formed in a tapered shape with the openings become smaller in the direction of flow of the underfill material for minimizing air entrapment. The method may further include the step of flowing the underfill material across a top surface of the stencil by pushing the underfill material with a squeegee. The stencil provided may be a screen such that the method practiced is a screen printing method. The step of flowing an underfill material across a top surface of the stencil or the screen may further be carried out at least two times. The present invention is further directed to a flip chip package that is formed according to such method.

In an alternate embodiment, a method for dispensing underfill in a flip chip package formed of an IC chip and a substrate may be carried out by the steps of first providing an IC chip which has a first plurality of spaced-apart solder balls formed on a first surface and positioning the IC chip with the first surface facing upwardly, the first plurality of spaced-apart solder balls has a gap between each two adjacent solder balls, then providing an underfill dispensing head equipped with a second plurality of dispensing nozzles, then dispensing a second plurality of droplets of an underfill material from the second plurality of dispensing nozzles onto the first surface of IC chip filling a gap between each two adjacent solder balls, then curing the droplets of underfill material at least partially such that surfaces of the droplets no longer sticks to other surfaces, then providing a substrate which has a first plurality of electrical conductors formed on a second surface, then positioning the second surface of the surface juxtaposed to the first surface of the IC chip such that the first plurality of electrical conductors is in intimate contact with the first plurality of spaced-apart solder balls forming the flip chip package, and heating the flip chip package to a temperature not lower than the reflow temperature for the solder balls for reflowing the solder in the solder balls and for curing the underfill material.

In the method, the first plurality of spaced-apart solder balls may be formed on a first plurality of spaced-apart bond pads. The second plurality of droplets of an underfill material each has a diameter between about 50 $\mu$m and about 300 $\mu$m. The gap between each two adjacent solder balls is between about 100 $\mu$m and about 500 $\mu$m. The reflow temperature for the solder balls is between about 210° C. and about 240° C. The method may further include the step of reflowing the solder in the solder balls by infrared heating for a time period not exceeding 20 minutes.

In still another alternate embodiment, a method for dispensing underfill in a flip chip package formed of an IC chip and a substrate can be carried out by the steps of first providing a substrate which has a first plurality of spaced-apart electrical conductors formed on a first surface and positioning the substrate with the first surface facing upwardly, the first plurality of spaced-apart electrical conductors has a gap between each two adjacent conductors, then providing an underfill dispensing head equipped with a second plurality of dispensing nozzles, dispensing a second plurality of droplets of an underfill material from the second plurality of dispensing nozzles onto the first surface of the substrate to fill gaps between each two adjacent spaced-apart electrical conductors, providing an IC chip which has a first plurality of spaced-apart solder balls formed on a second surface, then positioning the first surface of the substrate juxtaposed to the second surface of the IC chip such that the first plurality of electrical conductors are in intimate contact with the first plurality of spaced-apart solder balls forming the flip chip package, and heating the flip chip package to a temperature not lower than the reflow temperature of the solder balls for reflowing the solder in the solder balls and for curing the underfill material.

In the method, the first plurality of spaced-apart solder balls are formed on a first plurality of spaced-apart bond pads on the second surface of the IC chip. The second plurality of droplets of an underfill material each has a diameter of between about 50 $\mu$m and about 350 $\mu$m. The gap between each two adjacent, spaced-apart electrical conductors is between about 100 $\mu$m and about 500 $\mu$m. The reflow temperature for the solder balls is between about 210° C. and about 240° C. The method may further include the step of reflowing the solder in the solder balls by infrared heating for a time period not exceeding 20 minutes.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for dispensing underfill in a flip chip package that is formed of an IC chip and a substrate and devices formed by such method.

In a preferred embodiment, the present invention method for dispensing underfill in a flip chip package can be carried out by a screen printing or stencil printing method. In the method, a screen or a stencil is first provided which are equipped with slot openings in the screen or stencil that corresponds to the edges of the IC die that the screen or stencil is positioned thereon. Several major benefits can be achieved by this method. First, the method encompasses flexible parameters which may be adjusted for each particular application. For instance, for filling flip chip packages that are made up of small IC dies, i.e., smaller than 10 mm×10 mm, only one or two slot openings are required for each IC die such that, when an underfill material is squeegeed from the top of the stencil or screen, a minimal air entrapment problem is encountered. To further eliminate or avoid the air entrapment problem, the slot openings may be designed in a tapered form. In other words, the openings become smaller in the direction of the underfill material flow. For larger IC dies, those of areas larger than 10 mm×10 mm, three slot openings are required for each IC die wherein the slot openings are arranged in a U-shape surrounding the IC die which is positioned immediately below the slot openings. Of the three slot openings, one is positioned horizontally along the leading edge of the IC die, while the other two openings are positioned perpendicularly along the two sides of the IC die in a tapered form.

When the screen printing, or stencil printing method is utilized in the present invention, the amount of the underfill material flown into the flip chip package can be suitably controlled by either the size of the slot openings or the number of printing that is carried out on the same screen or stencil. For instance, when a larger quantity of underfill material is necessary for filling the standoff in a flip chip package, the slot openings may be made larger than that normally required, or two or three printing processes by moving an underfill material with a squeegee on top of the screen or stencil may be desirable such that sufficient amount of underfill material is filled into the standoff area. The stencil is normally constructed of a heavier gauge sheet metal than that used in screen.

The present invention in an alternate embodiment, can also be carried out by utilizing an underfill dispensing head which is equipped with a multiple number of dispensing nozzles. In the method, droplets of underfill material of suitable diameters may be dispensed onto top surface of an IC die filling the gaps in between the spaced-apart solder balls, or onto a top surface of a substrate filling the gaps inbetween the spaced-apart electrical conductors formed on such surface. After the droplets of the underfill material are first dispensed onto the top surface of an IC die, a low temperature pre-cure procedure may be carried out to partially cure the underfill layer such that it is no longer sticky for easier handling. The IC die and the substrate are then married together by intimately joining the plurality of solder balls with the plurality of electrical conductors with an underfill material filled in between the gaps. The IC die/substrate assembly is then placed in a reflow oven at a temperature of at least the reflow temperature of the solder material used in the solder ball. For instance, the total time of reflow does not normally exceed 20 minutes. Another advantage achieved by the present invention alternate embodiment method is that the solder reflow and underfill curing process may be carried out in the same reflow oven and in the same heat treatment process. There is no need for a separate heating step for curing the underfill material.

Figure 4B:
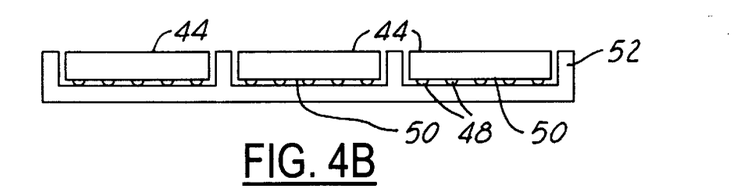
FIG. 4B is a schematic illustrating the IC dies of FIG. 4A after they are positioned in a storage tray.
Figures 4C, 4D, 4E, 4F:
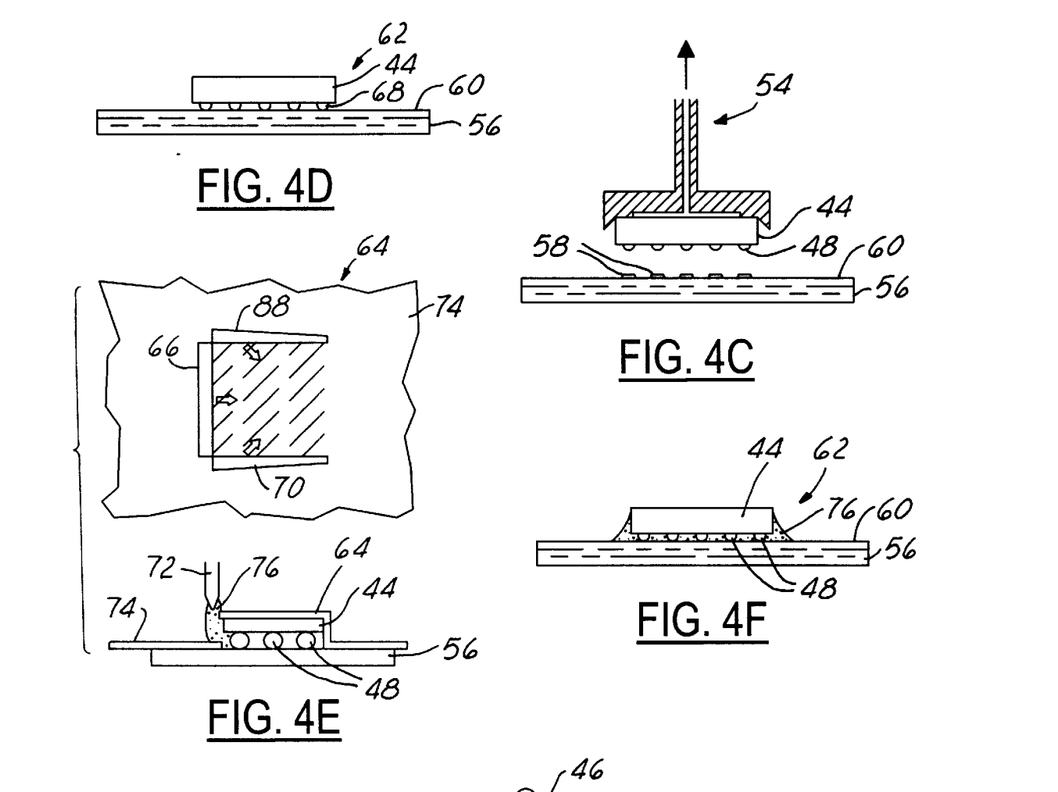
FIG. 4C is a schematic illustrating the IC die being positioned over a substrate by a vacuum holding device.
FIG. 4D is a schematic illustrating the IC die of FIG. 4C after bonded to the substrate.
FIG. 4E is a schematic illustrating the present invention gap filling method by an underfill material utilizing a stencil printing technique.
FIG. 4F is a schematic illustrating the presenting invention flip chip package after the gap is filled by a stencil printing technique.

Referring now to FIG. 4A, which is similar to FIG. 3A, wherein a wafer 42 is severed into IC dies 44 by a diamond cutting saw 46. A plurality of solder balls 48 have already been formed on the IC dies by any one of commercially available methods. After the IC dies 44 have been severed from the wafer 42, as shown in FIG. 4B, the IC dies 44 with surface 50 are placed in a storage tray 52. In the next step of the process, a vacuum die holder 54 is utilized to hold an IC die 44 and removing it from the storage tray 52 such that the die 44 is positioned over a substrate 56. It should be noted that a plurality of electrical conductors 58 which are positioned corresponding to the positions of the solder balls 48 are provided on a top surface 60 of the substrate 56. The substrate 56 may be either a printed circuit board or an interposer. After the IC die 44 is mounted to substrate 56 by intimately contacting the solder balls 48 with the electrical conductors 58, as shown in FIG. 4D, a solder reflow process is carried out to reflow the solder and to form a permanent bond between the IC die 44 and the substrate 56. It should be noted that the plurality of electrical conductors 58 are not shown in FIG. 4D for simplicity reasons. The flip chip assembly 62 is now ready for the underfill filling process.

As shown in FIG. 4E, a screen, or stencil 64 is provided which is positioned on top of the IC die 44 intimately mating the top surface of the die. As shown in FIG. 4E, the stencil 64 is provided, for each IC die, with three slot openings 66, 88 and 70. The slots are arranged in a U-shape surrounding the edges of an IC die 44 situated immediately below the stencil sheet 64. A squeegee 72 is utilized to push, or brush a suitable amount of underfill material across the top surface 74 of the stencil 64. The underfill material 76 is pushed into the slot opening 66, 88 and 70 and thus filling the standoff 68 formed between the IC die 44, the substrate 56 and the plurality of solder balls 48.

The processing parameters for use in the present invention preferred embodiment method may be suitably adjusted to fit each particularly application. For instance, the number of slot openings may not always be three for each IC die. For smaller IC dies, i.e., those having a total area less than 10 mm×10 mm, one slot opening 66, or two slot openings 66 and 88 may be adequate for filling the underfill material 76 into the standoff 68. For IC dies larger than 10 mm×10 mm, three slot openings may be more suitable such that only one stencil printing process needs to be carried out. The width of the openings 66, 88 and 70 also determines the amount of the underfill material 76 that enters into the standoff 68.

As shown in FIG. 4E, the slot openings 88 and 70 are formed in a tapered shape such that air entrapment in the underfill material 76 may be minimized during the squeegee-fill process. The amount of the underfill 76 that enters into the standoff 68 may further be controlled by the number of times that the screen or stencil printing process is carried out on the same IC die. For instance, when a larger amount of underfill material is desired, the squeegee-fill process may be repeated two or three times to ensure a suitable amount of underfill has been pushed into the stand-off area.

A further advantage made possible by the present invention preferred embodiment screen printing or stencil printing method is that a multiple number, as many as 100 flip chip packages may be filled with the underfill material in a single process. This is carried out by providing suitable slot openings for each IC die that the stencil plate is positioned on. The viscosity of the underfill material is also important and should be suitably controlled for a reliable screen printing or stencil printing process. It has been found that for an underfill material made of a silica filled epoxy which contains 60~70 wt % silica for reduced coefficient of thermal expansion, the epoxy material may be cured at 165° C. for 30 minutes. In filling a flip chip package that has a standoff between about 25 µm and about 200 µm, the substrate is normally heated to a temperature between about 60° C. and about 90° C. in order to facilitate the underfill filling process. When an increase in the flow rate of the underfill material through the standoff area is desired, the viscosity of the underfill material may be reduced to accomplish such purpose. The stencil plate or the screen should be positioned on top of the IC die to form an intimate contact with no gap allowed therein between.

After the underfill material 76 completely fills the standoff 68 in the flip chip package 62, the package 62 may be placed in an oven for curing the underfill material. A completed flip chip package 62 with a suitable underfill coverage between the IC die and the substrate is shown in FIG. 4F.

Figure 5A:
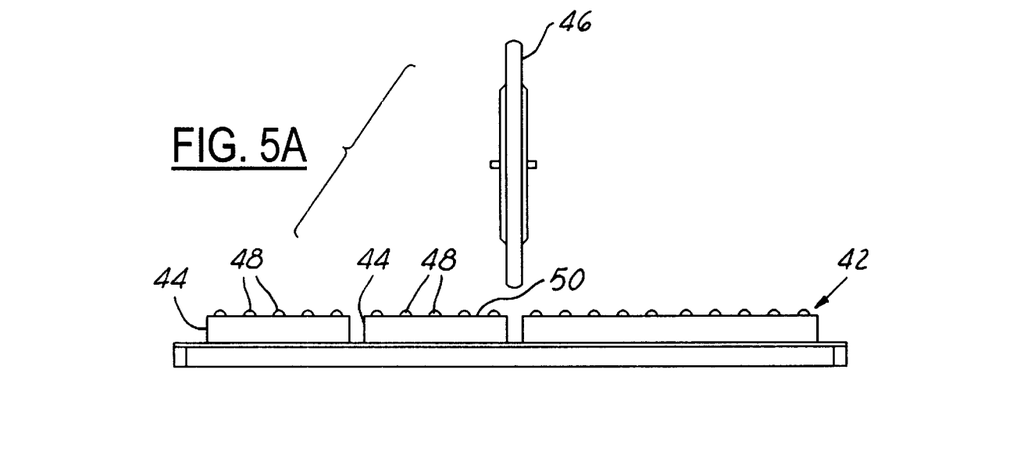
FIG. 5A is a schematic of an alternate embodiment of the present invention method in which IC dies are first severed by a diamond saw from a wafer.
Figure 5B:
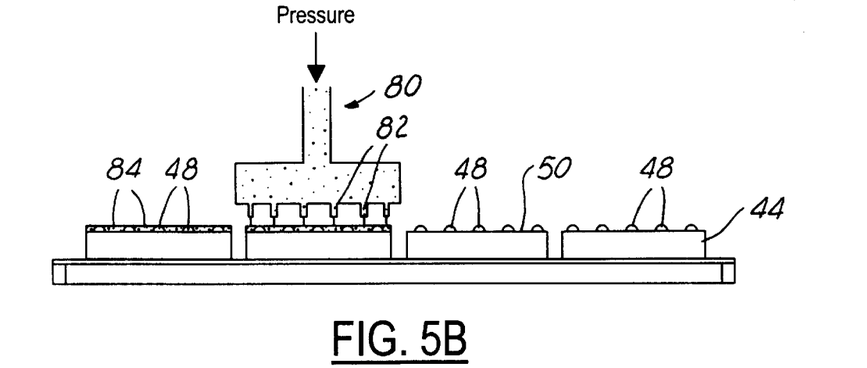
FIG. 5B is a schematic illustrating an underfill material being dispensed onto the top surface of the IC die by a multiplicity of underfill dispensing nozzles.
Figure 5C:
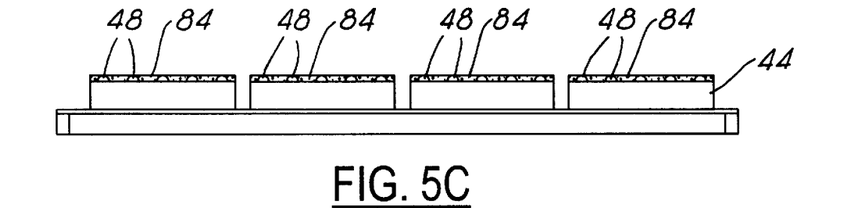
FIG. 5C is a schematic illustrating the IC die after being filled with an underfill material between the solder balls.
Figure 5D:
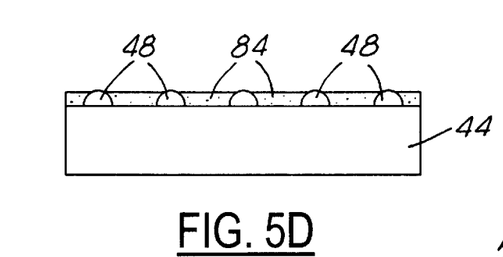
FIG. 5D is a schematic illustrating an enlarged, cross-sectional view of the IC die of FIG. 5C after being filled with an underfill material between the solder balls.
Figure 5E:
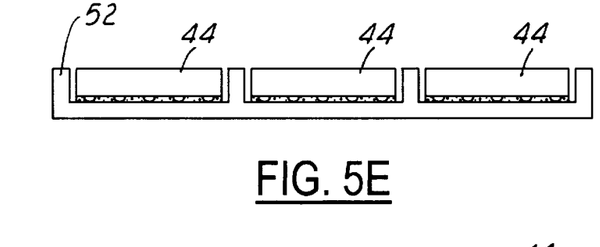
FIG. 5E is a schematic illustrating the present invention method after the IC dies with an underfill coating are positioned face-down in a storage tray.

In an alternate embodiment, the present invention may further be carried out by utilizing a dispensing head for dispensing the underfill material directly on top of either an IC die or a substrate. FIGS. 5A~5G illustrates such a process where droplets of underfill material are dispensed on top of an IC die. FIG. 5A is similar to that of FIG. 4A wherein IC dies 44 are severed from a silicon wafer 42 by utilizing a diamond saw 46. A dispensing head 80 for dispensing underfill material 84 in between the spaced-apart solder balls 48 is shown in FIG. 5B. The dispensing head 80 is equipped with a multiplicity of dispensing nozzles 82 wherein each of the nozzle is positioned corresponding to the position of the gaps 68 between the solder balls. Droplets of underfill material having diameters between about 100 µm and about 200 µm may be suitably used for dispensing on top of the surface 50 of the IC dies 44. It should be noted that the solder balls are normally formed with a pitch between about 100 µm and about 500 µm, and an average pitch of about 300 µm. A low flow rate underfill material may be a high viscosity epoxy with silica fill that has a pot life of 48 hours. The underfill material this is commercially available is normally filled with a flux for cleaning the surface to be bonded thereto. After all the dies 44 are filled by the dispensing head 80, as shown in FIGS. 5C and 5D, the IC dies 44 are pre-cured at a low temperature for preventing stickiness on the surface of the underfill. An enlarged cross-sectional view of the IC die 44 is shown in FIG. 5D to illustrate the underfill 84 which fills up the gap between the spaced-apart solder balls 48.

Figure 5F:
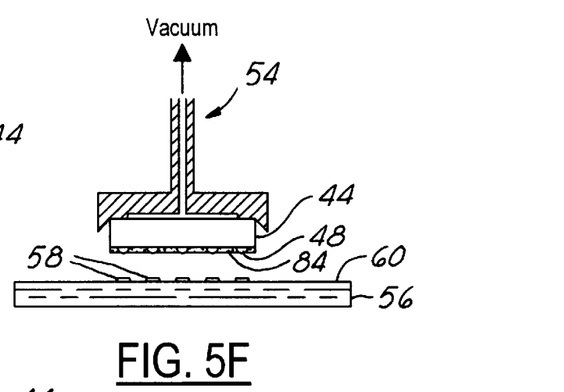
FIG. 5F is a schematic illustrating the present invention IC die being positioned on top of a substrate by a vacuum holding device.
Figure 5G:
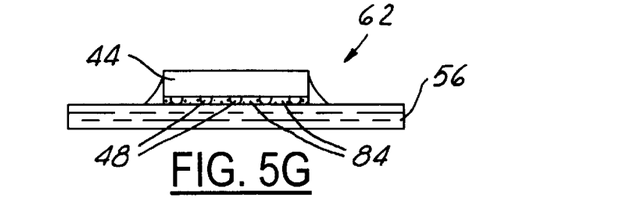
FIG. 5G is a schematic illustrating the present invention flip chip package after the underfill covered IC die is bonded to the substrate.

The IC dies 44, after the pre-cure process at a low curing temperature, are then positioned face down in a storage tray 52 and transported to the next process station for combining with a substrate. This is shown in FIG. 5F, wherein a vacuum die holder 54, similar to that shown in FIG. 4C, is used to pick up the IC die 44 with the underfill material 84. It is to be noted that a plurality of electrical conductors 58 are preformed on the top surface 60 of the substrate for electrical communication with the solder balls 48. After the IC die 44 is mounted to the substrate 56 forming intimate contact between the plurality of solder balls 48 and the plurality of electrical conductors 58, a single solder reflow and underfill curing process is conducted in a reflow oven which may be heated by infrared heating means. A suitable reflow temperature is between about 210° C. and about 240° C. which is adequate for both the reflow of the solder and the curing of the underfill material. A suitable time period used for such reflow/curing process is less than 20 minutes. A completed flip chip package 62 is shown in FIG. 5G after the reflow/curing process.

Figure 6A:
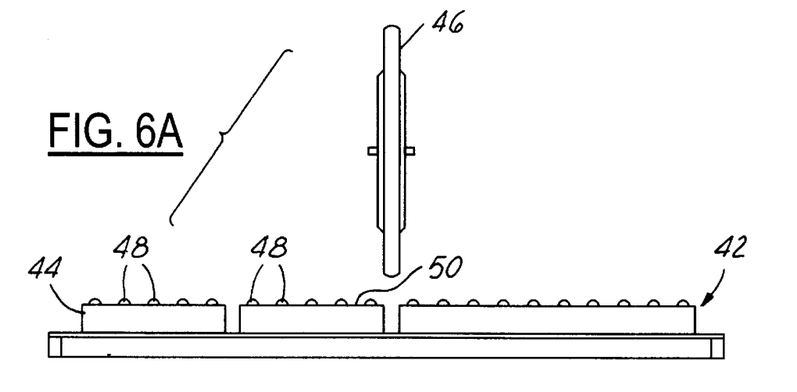
FIG. 6A is a schematic illustrating another alternate embodiment of the present invention method in which IC dies are first severed from a wafer by a diamond saw.
Figure 6B:
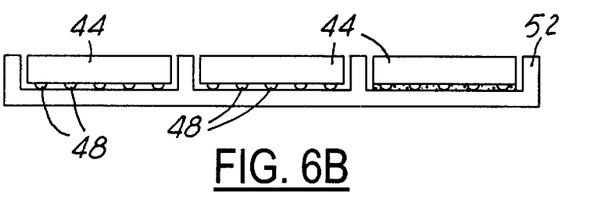
FIG. 6B is a schematic illustrating the IC dies of FIGS. 6A after being positioned in a storage tray.
Figure 6C:
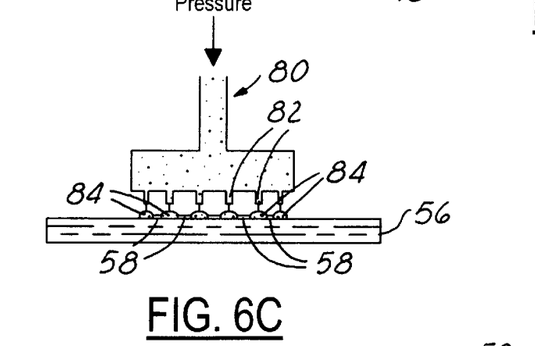
FIG. 6C is a schematic illustrating an underfill dispensing head dispenses underfill material through nozzles onto the top surface of a substrate filling gaps between spaced-apart electrical conductors.
Figure 6D:
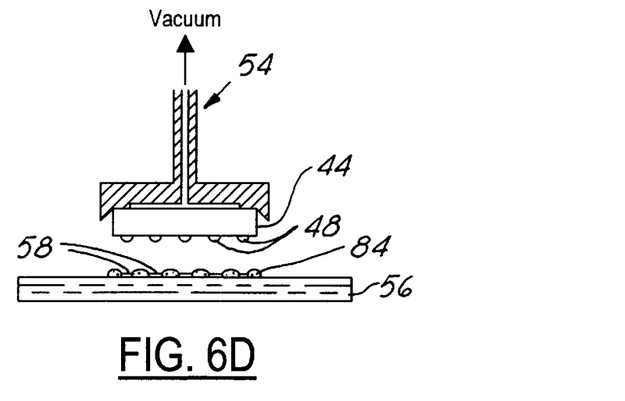
FIG. 6D is a schematic illustrating an IC die being positioned by a vacuum holding device over the substrate of FIG. 6C.
Figure 6E:
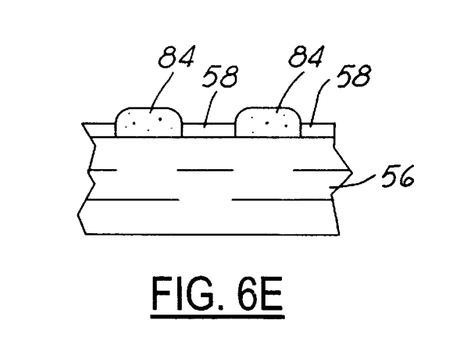
FIG. 6E is a partial, enlarged cross-sectional view of the substrate of FIG. 6D illustrating the solder balls and the underfill material filling the gaps thereinbetween.

In another alternate embodiment, as shown in FIGS. 6A~6F, an underfill dispensing head is used to dispense droplets of underfill material directly on the top surface of a substrate, instead of on the top surface of an IC die. Referring now to FIG. 6A, which is similar to FIG. 5A, a diamond saw 46 is used to sever silicon wafer 42 into IC dies 44 with surface 50. After the IC dies 44 are severed from the wafer 42, they are individually stored in a storage tray 52 in a face-down position. This is shown in FIG. 6B. An underfill dispensing head 80 is then utilized to dispense, through a multiple number of dispensing nozzles 82, an underfill material 84 in between the spaced-apart electrical conductors 58. An enlarged, cross-sectional view of the substrate 56, the electrical conductors 58 and the underfill droplet 84 are shown in FIG. 6E.

Figure 6F:
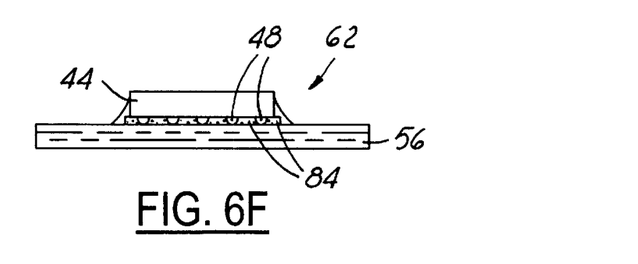
FIG. 6F is a schematic showing the flip chip package after the IC die is bonded to the underfill covered substrate.

A vacuum die holder 54 is then used to position an IC die 44 facing the substrate 56 with the plurality of solder balls 48 aligned with the plurality of electrical conductors 58. The IC die 44 is then placed on top of the substrate 56 with the solder balls in intimate contact with the electrical conductors. In the final process, as shown in FIG. 6F, the flip chip package 62 is positioned into a reflow oven for the solder reflow and underfill curing process conducted simultaneously. It should be noted that, in this second alternate embodiment, a pre-cure step for the underfill material is not necessary since the underfill material is not first deposited on an IC die, instead, it is deposited onto a substrate surface. As long as the substrate is not stored in a storage tray faced-down, the sticky surface of the underfill droplets does not affect the process. The present invention second alternate embodiment therefore saves a pre-cure step when compared to the first alternate embodiment by depositing droplets of an underfill material directly on an IC die surface.

The present invention and the flip chip packages formed by such method have been amply demonstrated in the above descriptions and in the appended drawings of FIGS. 4A~6F. The present invention can be carried out in either a screen printing (stencil printing) or a dispensing process for dispensing droplets of underfill material on the surface of either an IC die or a substrate. Numerous benefits are achieved by the present invention method which include shorter cycle time, easier process control and an overall reliable process.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. A method for dispensing underfill in a flip chip package formed of an IC chip and a substrate comprising the steps of:
   providing a flip chip package of an IC chip bonded to a substrate by a plurality of spaced-apart solder balls, a gap formed between said IC chip, said substrate and said plurality of solder balls,
   positioning a stencil on top of and in intimate contact with a top surface of said IC chip, said stencil being provided with at least two slot openings corresponding to at least two adjacent edges of said IC chip such that said at least two slot openings are in fluid communication with said gap, and
   flowing an underfill material across a top surface of said stencil in a direction toward said IC chip such that said underfill material flows through said at least two slot openings and filling said gap between said IC chip, said substrate and said plurality of spaced-apart solder balls.

2. A method for dispensing underfill in a flip chip package formed of an IC chip and a substrate according to claim 1, wherein said gap formed is a standoff between said plurality of solder balls.

3. A method for dispensing underfill in a flip chip package formed of an IC chip and a substrate according to claim 1, wherein said step for providing a flip chip package further comprising the steps of:
   providing an IC chip having a first plurality of bond pads formed on a first surface,
   providing a substrate having a first plurality of electrical conductors formed on a second surface, and
   bonding said first plurality of bond pads to said first plurality of electrical conductors by said first plurality of spaced-apart solder balls.

4. A method for dispensing underfill in a flip chip package formed of an IC chip and a substrate according to claim 3 further comprising the step of reflowing said solder balls at an elevated reflow temperature.

5. A method for dispensing underfill in a flip chip package formed of an IC chip and a substrate according to claim 1, wherein said gap formed between said IC chip, said substrate and said plurality of spaced-apart solder balls is between about 25 $\mu$m and about 200 $\mu$m.

6. A method for dispensing underfill in a flip chip package formed of an IC chip and a substrate according to claim 1 further comprising the step of providing a stencil having at least three slot openings corresponding to three adjacent edges of said IC chip such that said at least three slot openings are in fluid communication with said gap.

7. A method for dispensing underfill in a flip chip package formed of an IC chip and a substrate according to claim 1 further comprising the step of positioning a stencil on top of and in intimate contact with top surfaces of a multiplicity of IC chips, said stencil being provided with at least two slot openings corresponding to and for at least two adjacent edges of each of said multiplicity of IC chips.

8. A method for dispensing underfill in a flip chip package formed of an IC chip and a substrate according to claim 6, wherein said at least three slot openings corresponding to three adjacent edges of said IC chip are arranged in a U-shape with the slot opening in the bottom of said U-shape being first contacted by said flow of underfill material.

9. A method for dispensing underfill in a flip chip package formed of an IC chip and a substrate according to claim 6, wherein said at least three slot openings corresponding to three adjacent edges of said IC chip are arranged in a U-shape with the slot openings in the two sides of said U-shape being formed in a tapered shape and wherein said openings become smaller in the direction of flow of said underfill material for minimizing air entrapment.

10. A method for dispensing underfill in a flip chip package formed of an IC chip and a substrate according to claim 1 further comprising the step of flowing said underfill material across a top surface of said stencil by pushing said underfill material with a squeegee.

11. A method for dispensing underfill in a flip chip package formed of an IC chip and a substrate according to claim 1, wherein said stencil provided is a screen while said method is a screen printing method.

12. A method for dispensing underfill in a flip chip package formed of an IC chip and a substrate according to claim 1, wherein said step of flowing an underfill material across a top surface of said stencil is carried out at least two times.

* * * * *